(12) United States Patent
Biber et al.

(10) Patent No.: US 8,664,956 B2
(45) Date of Patent: Mar. 4, 2014

(54) ANTENNA ARRANGEMENT FOR MAGNETIC RESONANCE APPLICATIONS

(75) Inventors: Stephan Biber, Erlangen (DE); Jürgen Nistler, Erlangen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 216 days.

(21) Appl. No.: 13/183,078

(22) Filed: Jul. 14, 2011

(65) Prior Publication Data

US 2012/0182013 A1 Jul. 19, 2012

(30) Foreign Application Priority Data

Jul. 16, 2010 (DE) .......................... 10 2010 027 297

(51) Int. Cl.
*G01V 3/00* (2006.01)
(52) U.S. Cl.
USPC .......................................... 324/318; 324/322
(58) Field of Classification Search
USPC .......... 324/318, 322, 321, 309, 307, 314, 300
See application file for complete search history.

(56) References Cited

U.S. PATENT DOCUMENTS

| | | | |
|---|---|---|---|
| 5,561,434 A | 10/1996 | Yamazaki | |
| 6,522,143 B1 * | 2/2003 | Fujita et al. | 324/318 |
| 7,119,541 B2 * | 10/2006 | Barberi | 324/318 |
| 7,965,082 B2 * | 6/2011 | Greim et al. | 324/318 |
| 8,013,605 B2 | 9/2011 | Matschl | |
| 8,193,812 B2 * | 6/2012 | Pinkerton et al. | 324/318 |

| | | | |
|---|---|---|---|
| 2006/0033497 A1 | 2/2006 | Chmielewski et al. | |
| 2009/0206840 A1 | 8/2009 | Overweg et al. | |
| 2009/0219024 A1 | 9/2009 | Matschl | |

FOREIGN PATENT DOCUMENTS

| | | |
|---|---|---|
| CN | 101473239 A | 7/2009 |
| DE | 10 2006 011 254 A1 | 10/2007 |
| JP | 9201346 A | 8/1997 |
| WO | WO 2007/104607 A1 | 9/2007 |

OTHER PUBLICATIONS

German Office Action dated Jun. 7, 2011 for corresponding German Patent Application No. DE 10 2010 027 297.3 with English translation.
Chinese Office Action dated Oct. 10, 2013 for corresponding Chinese Patent Application No. 201110197930.7 with English translation.

\* cited by examiner

*Primary Examiner* — Louis Arana
(74) *Attorney, Agent, or Firm* — Lempia Summerfield Katz LLC

(57) ABSTRACT

An antenna arrangement for magnetic resonance applications includes antenna elements substantially parallel to a common central axis, distributed around the central axis at a distance from the central axis, and enclosing an essentially cylindrical volume. The antenna arrangement includes intermediate connections that connect to immediately adjacent antenna elements at connection points that lie between the ends of the antenna elements. A preamplifier connects to each of the intermediate connections and has an output that, in a receive mode, corresponds to a respective feed-out point. In send mode, the antenna arrangement injects radio-frequency signals into the antenna elements using the injection points. The antenna arrangement is also configured to adjust the intermediate connections to a higher resistance when the antenna arrangement is in the send mode and at least some of the intermediate connections to a lower resistance when the antenna arrangement is in the receive mode.

21 Claims, 3 Drawing Sheets

ANTENNA ARRANGEMENT FOR MAGNETIC RESONANCE APPLICATIONS

This application claims the benefit of DE 10 2010 027 297.3, filed Jul. 16, 2010.

BACKGROUND

The present embodiments relate to an antenna arrangement for magnetic resonance applications.

Known antenna arrangements have a number of antenna elements that run or are substantially parallel to a common central axis and are distributed around the central axis at a distance from the central axis so that the antenna elements enclose a substantially cylindrical volume. The antenna elements in known arrangements are coupled at their ends via end rings and have a number of injection points. When the antenna arrangement is operating in send mode, radio frequency send signals may be injected into the antenna elements, such that corresponding element signals oscillate in the antenna elements. In known arrangements, respective element signals are uniform in respective antenna elements.

Birdcage resonators are constructed using this known arrangement. These known arrangements are also described, for example, in DE 10 2006 011 254 B4, as well as in corresponding US 2009/219024 A1.

Known antenna arrangements are used for sending excitation signals for magnetic resonance signals and for receiving magnetic resonance signals. The signals are, however, received with a relatively low signal-to-noise ratio (SNR). For this reason, prior art magnetic resonance imaging systems often utilize local coils to receive the magnetic resonance signals. Local coils are antenna structures that pick up the radio-frequency signal of the excited spin from the inside of the body of the object under examination. Low-noise preamplification may be applied to the radio-frequency signal. After further processing, such as, for example, frequency conversion and/or digitization, the local coils may forward the signal onto the receive and analysis system of the magnetic resonance system. With some known high-field systems (i.e., those having a basic magnetic field of at least 1 Tesla and, in some cases, more than 10 Tesla), the receive antennas are positioned close to the body in order to maximize the SNR in the received signal and, thus the diagnostic information.

The noise of a local coil is primarily caused by three physical effects: (1) the inherent thermal noise of the volume under examination, (2) the thermal noise of the lossy components such as, for example, ohmic losses in metals, dielectric losses in substrates, capacitors, and other discrete components, of the local coil, and (3) the inherent noise of the receive system. The inherent noise of the receive system consists partly of ohmic components and partly of electronic noise (e.g., shot noise, hot electron noise, trap noise, etc.). If the distance between the local coil and the volume under examination (Region of Interest=ROI) is increased to a value greater than approximately 2 cm, the signal received from the ROI falls more quickly than the noise of the local coil caused by the three physical effects described above. In turn, the SNR falls, and, thus, the image quality falls as well.

Using local coils close to the body is, however, disadvantageous. Using local coils in this way results in, for example, a significant additional time penalty, as the local coils must be attached and then removed at a later time. Such a time penalty is not seen when other imaging modalities (e.g., CT) are used. As a result of this time penalty, the efficiency and the throughput of the magnetic resonance system is reduced, which, in turn, increases the cost of the individual examination. In addition, the attachment of local coils adversely affects the patient's comfort and may give rise to claustrophobia. In some cases, this may cause the patient to refuse the examination. Moreover, because the local coils are connected to the receive and analysis system of the magnetic resonance system via screened cables, the magnetic resonance system includes a number of costly and complex connectors, sockets, and/or cables.

Because of these disadvantages, it is desirable to use antennas that are directly connected to the system but are not attached directly to, and are instead remote from, the body. However, because of the great distance between a receiver array (Remote Body Array=RBA) and the body, the receive signal from the ROI is very small. The noise in the receive coils remote from the body is thus dominated by the inherent noise of the coils. To achieve a better SNR, it is thus necessary to reduce the inherent noise of the receive coils. This may be done, for example, by using remote antennas with an extremely low inherent noise. This may be implemented by cooling the remote antennas or by using superconductors (including high-temperature superconductors). The integration of transmit and receive functionality into a common antenna system has already been proposed.

An array remote from the body may be used to take advantage of the benefits of parallel imaging. The array should have the highest possible number of receive antennas, which, in some cases, may be 512 channels. This type of receive array may be embodied as a structure separate from the send antennas. However, the problem with such an arrangement is that the send coil (Body Coil=BC) and the RBA are arranged in the immediate vicinity of one another. Arranging the receive antenna structures in the immediate vicinity of the send arrangement gives rise to couplings and eddy current paths that may, in turn, increase the losses. In addition, an electrical decoupling of the receive antennas from the send antennas becomes significantly more complicated.

Only one or two channels are generally needed to operate the send coil, since the send coil generally only has to be able to generate a circular-polarized excitation signal in the region of interest. In contrast, it is advantageous to construct the receiver arrangement as a multichannel arrangement having significantly more than two channels.

SUMMARY AND DESCRIPTION

The present embodiments may obviate one or more of the drawbacks or limitations in the related art. For example, an antenna arrangement that sends excitation signals and receives magnetic resonance signals using significantly more channels than needed to send the excitation signals may be provided.

In the present embodiments, the antenna arrangement includes immediately adjacent antenna elements that are connected to each other via controllable intermediate connections. The intermediate connections connect together points of the antenna elements that lie between their ends. The antenna arrangement further includes a preamplifier connected to each of the intermediate connections. When the antenna arrangements are in receive mode, the output of the preamplifier corresponds to a respective feed-out point for feeding out a received magnetic resonance signal. The arrangement is configured to control the intermediate connections to provide high resistance when the arrangement is in a send mode. The arrangement is configured to control at least some of the intermediate connections to provide low resistance when the arrangement is in a receive mode.

In one embodiment, a first additional preamplifier may be connected to injection points. When the antenna arrangement is in receive mode, the output of the first additional preamplifier correspond to a respective feed-out point configured to feed out or output of a received magnetic resonance signal. As a result, the injection points may be used bi-directionally.

The injection points are generally arranged in the area of the end rings. In one embodiment, the number of injection points may be equal to the number of antenna elements. Accordingly, the antenna arrangement may also be operated as an array when the antenna arrangement is in send mode. In another embodiment, the number of injection points may be less than the number of antenna elements. For example, two or four injection points may be sufficient to transmit a circular-polarizing radio frequency field.

In one embodiment, a second additional preamplifier may be connected in the area of the end rings between each of pairs of the antenna elements. When the antenna arrangement is in receive mode, the output of the second additional preamplifier corresponds to a respective feed-out point for feeding out a received magnetic resonance signal.

In one embodiment, at least one of the intermediate connections may feature a series circuit of a switching element and at least one capacitor. The voltage signal arising from the capacitor may be supplied to the preamplifier of the intermediate connection. The switching element is configured to adjust or control the intermediate connection to a high and/or low resistance.

In another embodiment, at least one of the intermediate connections may include a series circuit of a capacitor and a first inductor. The voltage signal from the capacitor may be supplied to the preamplifier of the intermediate connection. A series circuit of a PIN diode and a second inductor may be switched, in parallel, to the capacitor. The PIN diode is configured to adjust the intermediate connection to a high and/or low resistance.

In one embodiment, the series circuit of the capacitor and the first inductor may be tuned to the operating frequency of the antenna arrangement such that the series circuit and the first inductor resonate at the operating frequency of the antenna arrangement.

DETAILED DESCRIPTION OF THE DRAWINGS

Figure 1:
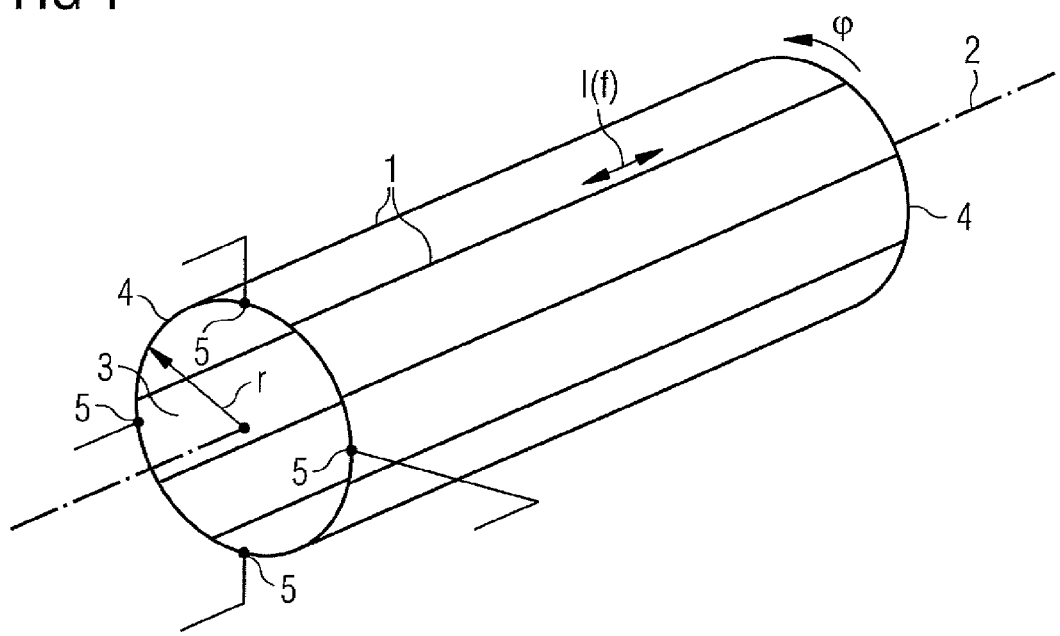
FIG. 1 shows a perspective diagram of one embodiment of an antenna arrangement.
Figure 2:
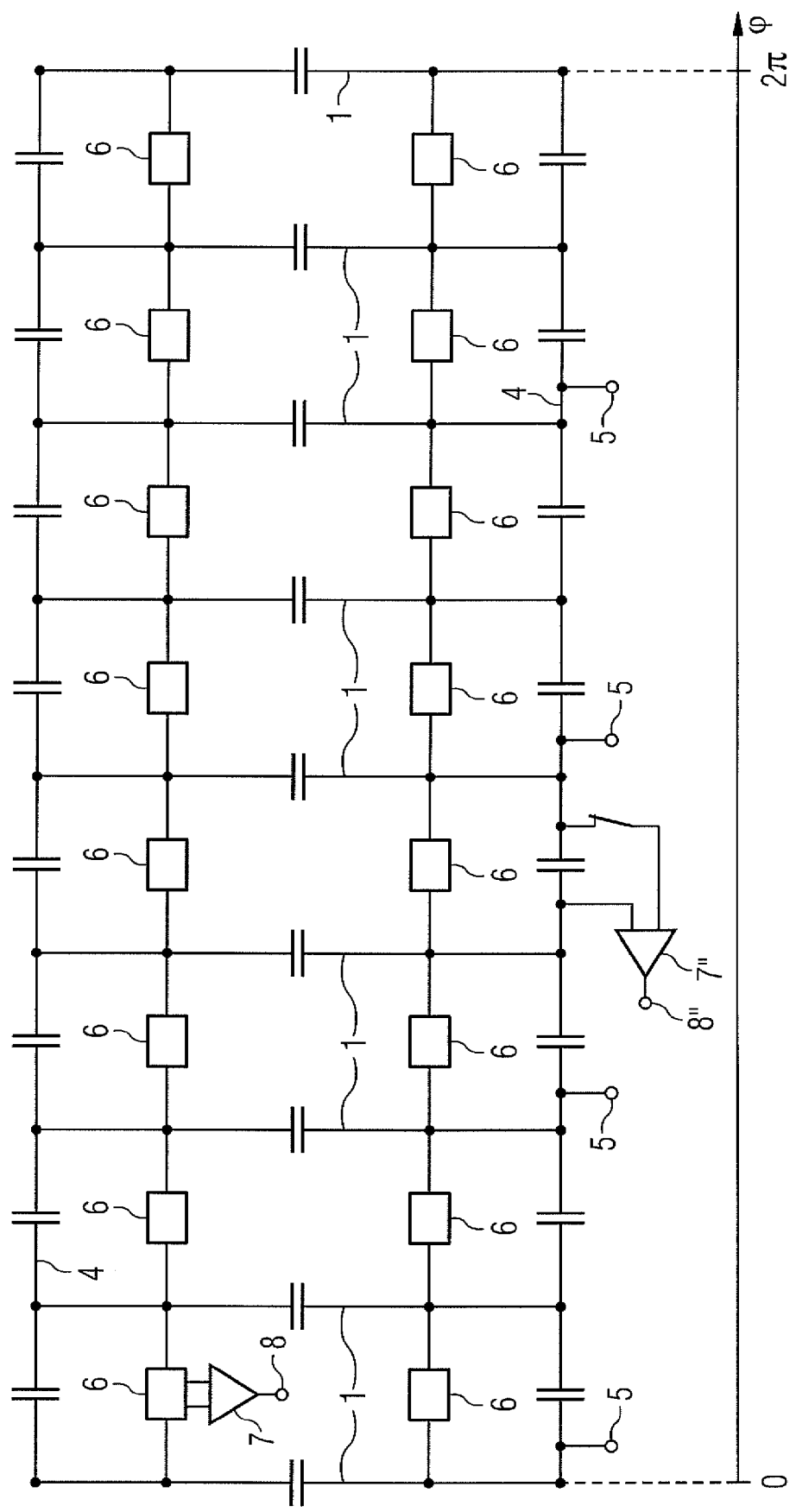
FIG. 2 shows the unrolled antenna arrangement of FIG. 1.

FIGS. 1 and 2 illustrate an antenna arrangement for magnetic resonance applications. The antenna arrangement includes a number of antenna elements 1. In the embodiment illustrated by FIGS. 1 and 2, there are eight antenna elements 1. In other embodiments, however, there may be more or less than eight antenna elements 1, provided that there are at least four antenna elements 1. In embodiments where the number of antenna elements 1 is greater than eight, the number may, but will typically not, be greater than 32. In general, the number of antenna elements 1 is an integer multiple of 4 such as, for example, 4, 8, 12, 16, etc. Preferably, the number of antenna elements 1 is a power of two (e.g., 4, 8, 16 and 32).

In the present embodiments, the antenna elements 1 are or run substantially parallel to a common central axis 2. In one embodiment, the antenna elements 1 are or run exactly parallel to the common central axis 2. The antenna elements 1 are distributed around the central axis 2 at a (radial) distance r from the central axis 2. The antenna elements 1 thus enclose a substantially cylindrical region of interest 3. The distance r between the antenna elements 1 and the central axis 2 is generally the same for all antenna elements 1 and when viewed over the length of the respective antenna element 1, the distance r is generally constant for each antenna element 1. The distance between each of the antenna elements 1 in the tangential direction φ is generally constant as well.

In other examples, the antenna arrangement may deviate from the cylinder shape described. For example, the distance r between each antenna element 1 may vary slightly such that the antenna elements 1 are arranged to form an oval or an ellipse. In some embodiments, the antenna elements 1 may be slightly inclined relative to the central axis 2 such that the region of interest 3 is slightly conical. In other embodiments, the antenna elements 1 may be slightly twisted so that the elements, like, for example, the rifles and sections of the barrel of a firearm, have a slight rifling around the central axis 2.

The degree to which the antenna elements 1 deviate from a parallel alignment with the central axis 2 is small. For example, the scalar product of a normalized vector that points in the direction of a respective antenna element 1 and a further normalized vector that is aligned parallel to the central axis 2 is generally or always greater than 0.95.

As shown in FIGS. 1 and 2, the antenna elements 1 are coupled to one another at their ends by end rings 4.

The antenna arrangement includes a number of injection points 5. When the antenna arrangement is in send mode, radio-frequency send signals may be injected into the injection points 5 and, thus, the antenna elements 1. In turn, corresponding element signals I oscillate in the antenna elements 1. Because the element signals I are uniform within the respective antenna elements 1, when the antenna arrangement is in the send mode, if a specific element signal I oscillates in a first area of a specific antenna element 1, the element signal I also oscillates in other areas of the respective antenna element 1.

As shown in FIGS. 1 and 2, the injection points 5 are generally arranged near or in the area of the end rings 4. In general, the antenna arrangement has at least two injection points but not more than one injection point per antenna element 1. Accordingly, the antenna arrangement, when it is in the send mode, generates a linear-polarized excitation field. In one embodiment, the antenna arrangement has four injection points 5. In this embodiment, the antenna arrangement generates a circular-polarized excitation field. In other embodiments, the antenna arrangement includes more than four injection points 5. In these embodiments, the antenna arrangement may be operable in send mode as an array antenna. However, regardless of how many injection points the antenna arrangement has, the oscillating element streams I in the antenna elements 1 are generally or always uniform within respective antenna elements 1.

The antenna arrangements described thus far correspond to designs for birdcage resonators. In the present embodiments, however, immediately adjacent antenna elements 1 of the antenna arrangement are connected to each other via intermediate connections 6. As shown in FIG. 2, the intermediate connections 6 connect points of the antenna element 1 to other points of a corresponding antenna element 1 that lie between the ends of the corresponding antenna element 1, such that the intermediate connections 6 that connect two specific antenna elements 1 are similar to bars of a ladder (i.e., uprights of the ladder are formed by the two specific antenna elements 1).

The number of intermediate connections 6 may differ. In the embodiment depicted by FIG. 2, the antenna arrangement includes two intermediate connections 6 per antenna element 1. In other embodiments, the antenna arrangement may only include one intermediate connection 6 per antenna element 1. In yet other embodiments, the antenna arrangement may include more than two intermediate connections 6 per antenna element 1 (e.g., the antenna arrangement may include 3, 4, 5, etc., intermediate connections 6 per antenna element 1).

In the present embodiments, the intermediate connections 6 are controllable. When the antenna arrangement is operated in send mode, the intermediate connections 6 are controlled or adjusted so that they are at high resistance. Accordingly, no, or only negligibly small, cross-currents flow in the intermediate connections 6 from one antenna element 1 to the other antenna element 1. When the antenna arrangement is operated in receive mode, the intermediate connections 6 are controlled or adjusted so that they are at a low resistance. Cross-currents may thus flow, via the end rings 4 exclusively, in the intermediate connections 6. As a result, the intermediate connections 6 may be used, when the antenna arrangement is in receive mode, to each receive a local magnetic resonance signal. To this end, a preamplifier 7 is connected to each of the intermediate connections 6. When the antenna arrangement is in receive mode, the output of the preamplifier 7 corresponds to a respective feed-out point 8 configured to feed out or output a received magnetic resonance signal.

Though FIG. 2 only depicts one of the intermediate connections 6 arranged in this way, the other intermediate connections 6 are arranged in a similar way, but are not shown in FIG. 2 for clarity purposes.

Figure 3:
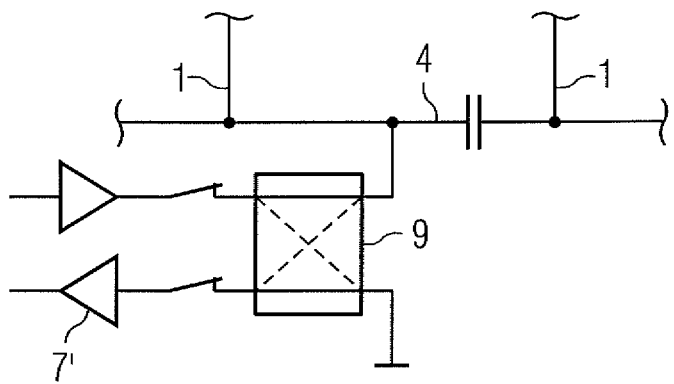
FIG. 3 shows a section and a connection of an end ring of the antenna arrangement of FIG. 1.

The injection points 5 also act as tap-off points for tapping off a received magnetic resonance signal. In one embodiment, a first additional preamplifier 7' is connected to each of the injection points 5 as shown in FIG. 3. When the antenna arrangement is in the receive mode, the output of the preamplifier corresponds to a first additional feed-out point 8' configured to feed out or output a received magnetic resonance signal. A coupling circuit 9 may also be included.

In the embodiment in which the number of injection points 5 is the same as the number of antenna elements 1, the antenna arrangement, when in receive mode, may receive, via the injection points 5, a number of signals equal to the number of antenna elements 1. Accordingly, as shown in FIG. 2, when the antenna arrangement has eight antenna elements 1, the arrangement may receive, via the intermediate connections 6, sixteen (2*8) magnetic resonance signals and, at the same time, receive an additional eight (1*8) magnetic resonance signals via the injection points 5. The antenna arrangement thus receives a total of twenty-four (3*8) magnetic resonance signals.

As noted above, the antenna arrangement may have fewer injection points than antenna elements 1. In such an embodiment, second additional preamplifier 7" may be connected to the arrangement near or in the area of the end rings 4 between each two of the antenna elements 1. Accordingly, when the antenna arrangement is in receive mode, the output of the second additional preamplifier 7" corresponds to a respective second additional feed-out point 8" configured to feed out or output a received magnetic resonance signal. FIG. 2 only depicts one second additional preamplifier 7" for clarity purposes.

Figure 4:
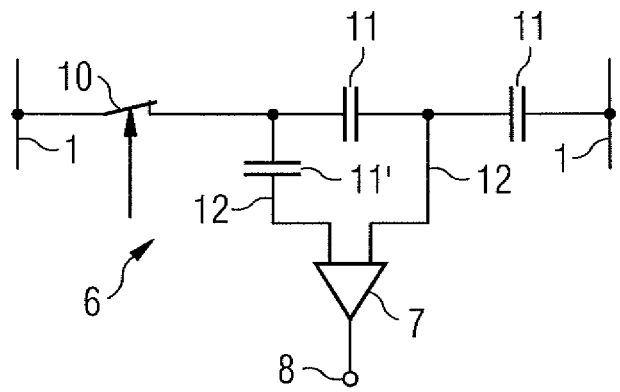
FIG. 4 shows one embodiment of an intermediate connection.
Figure 5:
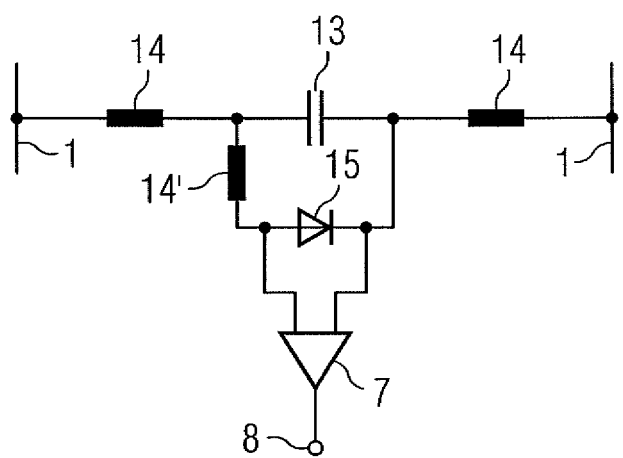
FIG. 5 shows another embodiment of an intermediate connection.

The intermediate connections 6 may be designed in a variety of different ways. FIGS. 4 and 5 illustrate one embodiment of the intermediate connections 6.

In the embodiment illustrated by FIG. 4, the intermediate connection 6 includes a series circuit of a switching element 10 and at least one capacitor 11. In FIG. 4, the intermediate connection 6 has two capacitors 11. The voltage signal from the capacitor 11 (or, if there are a number of capacitors 11, the signal from one of the capacitors 11) is supplied to the respective preamplifier 7. If necessary, a further capacitor 11' may be arranged in one or both of the supply leads 12 to the preamplifier 7. The respective switching element 10, when activated, is configured to control or adjust the intermediate connection 6 of FIG. 4 to a high and/or a low resistance.

The switching element 10 may be, for example, a diode switch or an MEMS (Micro Electromechanical Switch). In other embodiments, the switching element 10 may be a miniature relay, a MOSFET, or any other usable element.

The intermediate connection 6 shown in FIG. 6 includes a series circuit of a capacitor 13 and a first inductor 14. In one embodiment, the series circuit of capacitor 13 and first inductor 14 are tuned to the operating frequency f (see FIG. 1) of the antenna arrangement, so that the series circuit and the first inductor resonate at the operating frequency of the antenna arrangement. As shown in FIG. 5, the first inductor 14 may be separated, either symmetrically or unsymmetrically, into two parts. The voltage signal from the capacitor 13 is fed to the respective preamplifier 7. Connected in parallel to the capacitor 13 is a series circuit of a PIN diode 15 and a second inductor 14'. The PIN diode 15, when activated, is configured to control or adjust the intermediate connection 6 of FIG. 5 to a high and/or a low resistance.

Though not specifically disclosed herein, the intermediate connections 6 described in connection with FIGS. 5 and 6 may be used in a similar manner with the second additional preamplifiers 7" or with the first additional preamplifiers 7' that are connected to the injection points 5.

In general, though it is not required, the intermediate connections 6 are the same throughout the antenna arrangement. Either way, the respective intermediate connection 6 is controllable. In one preferred embodiment, the intermediate connections 6 are controllable together in the same way, such that all of the connections 6 are set or adjusted to a high resistance or set or adjusted to a low resistance at the same time. In another embodiment, however, individual intermediate connections 6 or groups of the intermediate connections 6 may be controlled.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. An antenna arrangement for magnetic resonance applications, the antenna arrangement comprising:
   a plurality of antenna elements that are coupled at ends of the plurality of antenna elements via end rings, substantially parallel to a common central axis and distributed around the common central axis at a distance from the common central axis, such that the plurality of antenna elements enclose an essentially cylindrical volume;

a plurality of injection points; intermediate connections that connect immediately adjacent antenna elements of the plurality of antenna elements at connection points that lie between the ends of the plurality of antenna elements; and a preamplifier connected to each of the intermediate connections and having an output that, when the antenna arrangement is in a receive mode, corresponds to a respective feed-out point configured to output a received magnetic resonance signal, wherein, in a send mode, the antenna arrangement is configured to inject radio-frequency send signals into the plurality of antenna elements using the plurality of injection points, such that corresponding uniform element signals oscillate in respective antenna elements of the plurality of antenna alements, and wherein the antenna arrangement is configured to adjust the intermediate connections to a higher resistance when the antenna arrangement is in the send mode and to adjust at least some of the intermediate connections to a lower resistance when the antenna arrangement is in the receive mode.

2. The antenna arrangement as claimed in claim 1, further comprising a first additional preamplifier connected to each injection point of the plurality of injection points, the first additional preamplifier having an output that, when the antenna arrangement is in the receive mode, corresponds to a respective first additional feed-out point configured to output a received magnetic resonance signal.

3. The antenna arrangement as claimed in claim 1, wherein the plurality of injection points are arranged near the end rings.

4. The antenna arrangement as claimed in claim 2, wherein the plurality of injection points are arranged near the end rings.

5. The antenna arrangement as claimed in claim 3, wherein the number of the plurality of injection points is less than the number of the plurality of antenna elements.

6. The antenna arrangement as claimed in claim 4, wherein the number of the plurality of injection points is less than the number of the plurality of antenna elements.

7. The antenna arrangement as claimed in claim 1, wherein the number of the plurality of injection points is less than the number of the plurality of antenna elements.

8. The antenna arrangement as claimed in claim 2, further comprising a second additional preamplifier connected to the end rings between each of the immediately adjacent antenna elements, the second additional preamplifier having an output that, when the antenna arrangement is in the receive mode, corresponds to a respective second additional feed-out point configured to output a received magnetic resonance signal.

9. The antenna arrangement as claimed in claim 4, further comprising a second additional preamplifier connected to the end rings between each of the immediately adjacent antenna elements, the second additional preamplifier having an output that, when the antenna arrangement is in the receive mode, corresponds to a respective second additional feed-out point configured to output a received magnetic resonance signal.

10. The antenna arrangement as claimed in claim 6, further comprising a second additional preamplifier connected to the end rings between each of the immediately adjacent antenna elements, the second additional preamplifier having an output that, when the antenna arrangement is in the receive mode, corresponds to a respective second additional feed-out point configured to output a received magnetic resonance signal.

11. The antenna arrangement as claimed in claim 1, wherein at least one of the intermediate connections has a series circuit of a switching element and at least one capacitor,
wherein the antenna arrangement is configured to feed a voltage signal from the at least one capacitor to the preamplifier of the respective intermediate connection, and
wherein the switching element, when activated, is configured to adjust the intermediate connection to a higher resistance, a lower resistance, or the higher resistance and the lower resistance.

12. The antenna arrangement as claimed in claim 2, wherein at 1 east one of the intermediate connections has a series circuit of a switching element and at least one capacitor,
wherein the antenna arrangement is configured to feed a voltage signal from the at least one capacitor to the preamplifier of the respective intermediate connection, and
wherein the switching element, when activated, is configured to adjust the intermediate connection to a higher resistance, a lower resistance, or the higher resistance and the lower resistance.

13. The antenna arrangement as claimed in claim 8, wherein at least one of the intermediate connections has a series circuit of a switching element and at least one capacitor,
wherein the antenna arrangement is configured to feed a voltage signal from the at least one capacitor to the preamplifier of the respective intermediate connection, and
wherein the switching element, when activated, is configured to adjust the intermediate connection to a higher resistance, a lower resistance, or the higher resistance and the lower resistance.

14. The antenna arrangement as claimed in claim 1, wherein:
at least one of the intermediate connections has a series circuit of a capacitor and a first inductor;
the antenna arrangement is configured to feed a voltage signal from the capacitor to the preamplifier of the respective intermediate connection;
the capacitor is connected in parallel to a series circuit of a PIN diode and a second inductor; and
the PIN diode, when activated, is configured to adjust the respective intermediate connection to a higher resistance, a lower resistance, or the higher resistance and the lower resistance.

15. The antenna arrangement as claimed in claim 14, wherein the series circuit of the capacitor and the first inductor are tuned to an operating frequency of the antenna arrangement such that the series circuit and the first inductor resonate at the operating frequency of the antenna arrangement.

16. The antenna arrangement as claimed in claim 2, wherein:
at least one of the intermediate connections has a series circuit of a capacitor and a first inductor;
the antenna arrangement is configured to feed a voltage signal from the capacitor to the preamplifier of the respective intermediate connection;
the capacitor is connected in parallel to a series circuit of a PIN diode and a second inductor; and
the PIN diode, when activated, is configured to adjust the respective intermediate connection to a higher resistance, a lower resistance, or the higher resistance and the lower resistance.

17. The antenna arrangement as claimed in claim 16, wherein the series circuit of the capacitor and the first inductor are tuned to an operating frequency of the antenna arrangement such that the series circuit and the first inductor resonate at the operating frequency of the antenna arrangement.

18. The antenna arrangement as claimed in claim 8, wherein:
- at least one of the intermediate connections has a series circuit of a capacitor and a first inductor;
- the antenna arrangement is configured to feed a voltage signal from the capacitor to the preamplifier of the respective intermediate connection;
- the capacitor is connected in parallel to a series circuit of a PIN diode and a second inductor; and
- the PIN diode, when activated, is configured to adjust the respective intermediate connection to a higher resistance, a lower resistance, or the higher resistance and the lower resistance.

19. The antenna arrangement as claimed in claim 18, wherein the series circuit of the capacitor and the first inductor are tuned to an operating frequency of the antenna arrangement such that the series circuit and the first inductor resonate at the operating frequency of the antenna arrangement.

20. The antenna arrangement as claimed in claim 11, wherein:
- at least one of the intermediate connections has a series circuit of a capacitor and a first inductor;
- the antenna arrangement is configured to feed a voltage signal from the capacitor to the preamplifier of the respective intermediate connection;
- the capacitor is connected in parallel to a series circuit of a PIN diode and a second inductor; and
- the PIN diode, when activated, is configured to adjust the respective intermediate connection to a higher resistance, a lower resistance, or the higher resistance and the lower resistance.

21. The antenna arrangement as claimed in claim 20, wherein the series circuit of the capacitor and the first inductor are tuned to an operating frequency of the antenna arrangement such that the series circuit and the first inductor resonate at the operating frequency of the antenna arrangement.

\* \* \* \* \*